United States Patent
Passlack et al.

(10) Patent No.: US 10,872,772 B2
(45) Date of Patent: Dec. 22, 2020

(54) SEMICONDUCTOR ARRANGEMENT AND METHOD OF MANUFACTURE

(71) Applicant: TAIWAN SEMICONDUCTOR MANUFACTURING COMPANY LIMITED, Hsin-Chu (TW)

(72) Inventors: Matthias Passlack, Huldenberg (BG); Martin Christopher Holland, Bertem (BG)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 0 days.

(21) Appl. No.: 16/207,809

(22) Filed: Dec. 3, 2018

(65) Prior Publication Data

US 2020/0135478 A1 Apr. 30, 2020

Related U.S. Application Data

(60) Provisional application No. 62/753,167, filed on Oct. 31, 2018.

(51) Int. Cl.
*H01L 29/778* (2006.01)
*H01L 21/285* (2006.01)
(Continued)

(52) U.S. Cl.
CPC .. *H01L 21/28575* (2013.01); *H01L 21/02546* (2013.01); *H01L 29/205* (2013.01);
(Continued)

(58) Field of Classification Search
CPC ... H01L 29/165; H01L 29/267; H01L 29/778; H01L 29/806; H01L 29/0843; H01L 29/0891; H01L 29/7839; H01L 29/0847; H01L 29/66431; H01L 29/41725; H01L 29/66636; H01L 29/66643; H01L 21/41791; H01L 21/823418; H01L 21/823414; H01L 21/823425; H01L 21/28575; H01L 21/0262; H01L 21/02532;
(Continued)

(56) References Cited

U.S. PATENT DOCUMENTS 6,963,090 B2 11/2005 Passlack et al.
2006/0220062 A1 10/2006 Green et al.
(Continued)

FOREIGN PATENT DOCUMENTS

EP 1936670 A2 6/2008

OTHER PUBLICATIONS

Richard J. W. Hill, et al., "Enhancement-Mode GaAs MOSFETs With an In0.3Ga0.7As Channel, a Mobility of Over 5000 cm2/V • s, and Transconductance of Over 475µS/µm", IEEE Electron Device Letters, Dec. 2007, pp. 1080-1082, Vo. 28, No. 12.
Karthik Rajagopalan, et al., "Enhancement-Mode GaAs n-Channel MOSFET", IEEE Electron Device Letters, 2006, pp. 959-962, vol. 27, No. 12.
(Continued)

*Primary Examiner* — Chuong A Luu
(74) *Attorney, Agent, or Firm* — Cooper Legal Group, LLC

(57) ABSTRACT

A semiconductor arrangement includes a semiconductor layer having a source/drain region and a first epitaxial layer over the semiconductor layer. The semiconductor arrangement includes a second epitaxial layer over the first epitaxial layer, wherein the first epitaxial layer and the second epitaxial layer define a contact structure for the source/drain region.

20 Claims, 7 Drawing Sheets

(51) Int. Cl.
  *H01L 21/02* (2006.01)
  *H01L 29/45* (2006.01)
  *H01L 29/205* (2006.01)
  *H01L 29/66* (2006.01)
(52) U.S. Cl.
  CPC ...... *H01L 29/452* (2013.01); *H01L 29/66462* (2013.01); *H01L 29/7786* (2013.01)
(58) Field of Classification Search
  CPC ......... H01L 21/02576; H01L 21/02639; H01L 2029/7858; H01L 29/205; H01L 29/452; H01L 29/66462
  USPC ........................................................ 257/194
  See application file for complete search history.

(56) References Cited

U.S. PATENT DOCUMENTS

| | | | |
|---|---|---|---|
| 2016/0020301 A1* | 1/2016 | Park | H01L 29/66636 257/283 |
| 2016/0300911 A1 | 10/2016 | Holland et al. | |
| 2017/0186654 A1* | 6/2017 | Li | H01L 29/66795 |
| 2018/0122946 A1 | 5/2018 | Holland | |
| 2018/0151683 A1* | 5/2018 | Yeo | H01L 21/823425 |

OTHER PUBLICATIONS

M. L. Huang, et al., "High performance In0.53Ga0.47As FinFETs fabricated on 300 mm Si substrate", Symposium on VLSI Technology Digest of Technical Papers, 2016, pp. 16-17.

* cited by examiner

US 10,872,772 B2

SEMICONDUCTOR ARRANGEMENT AND METHOD OF MANUFACTURE

RELATED APPLICATIONS

This application claims priority to U.S. Provisional Application 62/753,167, titled, "SEMICONDUCTOR ARRANGEMENT AND METHOD OF MANUFACTURE" and filed Oct. 31, 2018, which is incorporated herein by reference.

BACKGROUND

In semiconductor technology Group III-V (or III-V) semiconductor compounds, such as InGaAs, are used to form various integrated circuit devices, such as high power field-effect transistors, high frequency transistors, high electron mobility transistors (HEMTs), etc. A HEMT is a field effect transistor incorporating a junction between two materials with different band gaps to form the channel. Such a junction is sometimes referred to as a heterojunction. HEMTs have a number of attractive properties including, for example, high electron mobility, the ability to transmit signals at high frequencies, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
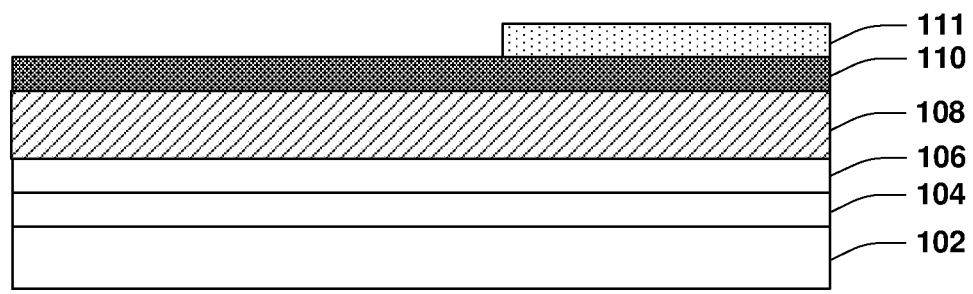
FIGS. 1-7 are illustrations of a semiconductor arrangement at various stages of fabrication, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor arrangement are provided herein. In some embodiments, the semiconductor arrangement comprises a contact structure for a source/drain region of a HEMT.

Turning to FIG. 1, a plurality of layers used in the formation of a semiconductor arrangement are illustrated, in accordance with some embodiments. In some embodiments, the semiconductor arrangement comprises an ohmic contact in a HEMT. The plurality of layers are formed over a substrate 102. In some embodiments, the substrate 102 comprises at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the substrate 102 comprises one of any Group III-V or Group II-VI semiconductor. In some embodiments, the substrate 102 comprises crystalline silicon.

In some embodiments, a first semiconductor layer 104 is formed over the substrate 102. In some embodiments, the first semiconductor layer 104 is an InGaAs channel layer. According to some embodiments, the first semiconductor layer 104 is formed by at least one of chemical vapor deposition (CVD), metal-organic CVD (MOCVD), low pressure CVD (LPCVD), plasma enhanced CVD (PECVD), ultra-high vacuum CVD (UHVCVD), reduced pressure CVD (RPCVD), atomic layer deposition (ALD), physical vapor deposition (PVD), pulsed laser deposition, sputtering, evaporative deposition, vapor phase epitaxy (VPE), molecular beam epitaxy (MBE), liquid phase epitaxy (LPE), or other applicable techniques. In some embodiments, one or more buffer layers (not shown) are formed between the substrate 102 and the first semiconductor layer 104 to relax a lattice mismatch between the first semiconductor layer 104 and the substrate 102. In some embodiments, the first semiconductor layer 104 is the substrate 102 or is part of the substrate 102. If the first semiconductor layer 104 is the substrate 102 or is part of the substrate 102, the substrate 102 is treated to have at least some of the aforementioned characteristics of the first semiconductor layer 104.

In some embodiments, a barrier layer 106 is formed over the first semiconductor layer 104 by at least one of CVD, MOCVD, LPCVD, PECVD, UHVCVD, RPCVD, ALD, PVD, pulsed laser deposition, sputtering, evaporative deposition, VPE, MBE, LPE, or other applicable techniques. In some embodiments, the barrier layer 106 is formed to a thickness of at least 5 nm to reduce leakage current and decrease parasitic capacitance. In some embodiments, the barrier layer 106 is formed of a semiconductor doped with a dopant to supply free carriers to the first semiconductor layer 104 by at least one of an in-situ deposition method or other applicable techniques. In some embodiments, the barrier layer 106 is an AlGaAs layer. In some embodiments, the barrier layer 106 is formed to be in direct contact with the first semiconductor layer 104 or is formed to be in direct contact with the substrate 102 in embodiments where the first semiconductor layer 104 is part of the substrate 102.

In some embodiments, a high-k dielectric layer 108 is formed over the barrier layer 106. As used herein, the term "high-k dielectric layer" refers to a material having a dielectric constant, k, greater than about 3.9, which is the k value of $SiO_2$. The material of the high-k dielectric layer may be any suitable material. Examples of the material of the high-k dielectric layer include but are not limited to $Ga_2O_3$, $GdGaO$, $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, $SiON$, $SiN_x$, or other suitable materials. Each value of x is independently from 0.5 to 3, and each value of y is independently from 0 to 2. The high-k dielectric layer 108 is formed over the barrier layer 106 by at least one of CVD, MOCVD, LPCVD, RPCVD, PECVD, ALD, PVD, pulsed laser deposition, sputtering, evaporative deposition, VPE, MBE, ALD and LPE, or other applicable techniques. In some embodiments, the high-k dielectric layer 108 is formed to be in direct contact with the barrier layer 106.

In some embodiments, a gate metallization layer 110 is formed over the high-k dielectric layer 108. In some embodiments, the gate metallization layer 110 comprises at least one of a conductive metallic layer or an electrically conducting layer. In some embodiments, the gate metallization layer 110 comprises at least one of Co, Ni, W, Ti, Ta, Cu, Al, Mo, TiN, TaN, WSi, Ni—Si, Co—Si, WN, TiAlN, TaCN, TaC, TaSiN, metal alloys such as Ti—Al alloy, Al—Cu alloy, or other suitable materials. In some embodiments, the gate metallization layer 110 is formed by at least one of PVD, CVD, LPCVD, ALCVD, UHVCVD, RPCVD, VPE, MBE, LPE, or other applicable techniques. In some embodiments, the gate metallization layer 110 is subjected to chemical mechanical polishing (CMP). In some embodiments, the gate metallization layer 110 is formed to be in direct contact with the high-k dielectric layer 108.

According to some embodiments, a photoresist layer 111 is formed over the gate metallization layer 110. In some embodiments, the photoresist layer 111 is formed by at least one of spinning, spray coating, or other applicable techniques. The photoresist layer 111 comprises a light sensitive material such that properties, such as solubility, of the photoresist layer 111 are affected by light. The photoresist layer 111 is either a negative photoresist or a positive photoresist. With respect to a negative photoresist, regions of the negative photoresist become insoluble when illuminated by a light source such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of the template between the light source and the positive photoresist. In some embodiments, the photoresist layer 111 is formed to be in direct contact with the gate metallization layer 110.

Figure 2:
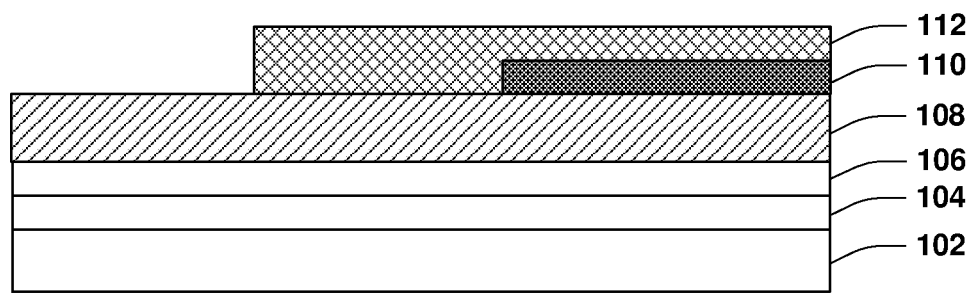

As illustrated in FIG. 1, the photoresist layer 111 is patterned to expose a portion of the gate metallization layer 110, according to some embodiments. Referring to FIG. 2, a portion of the gate metallization layer 110 not underlying, and thus not protected by, the patterned photoresist layer 111 is removed by an etching process. For example, in the illustrated embodiment, a portion of the gate metallization layer 110 is removed to expose a first portion of the high-k dielectric layer 108. In some embodiments, the etching process is at least one of a plasma etching process, a reactive ion etching (RIE) process, a wet etching process, or other applicable techniques. The patterned photoresist layer 111 is then removed to expose the gate metallization layer 110, and a second photoresist layer 112 is formed over the gate metallization layer 110 and the first portion of the high-k dielectric layer 108. In some embodiments, the second photoresist layer 112 is formed to be in direct contact with the gate metallization layer 110 and the high-k dielectric layer 108.

In some embodiments, the second photoresist layer 112 is formed by at least one of spinning, spray coating, or other applicable techniques. The second photoresist layer 112 comprises a light sensitive material such that properties, such as solubility, of the second photoresist layer 112 are affected by light. The second photoresist layer 112 is either a negative photoresist or a positive photoresist.

Figure 3:
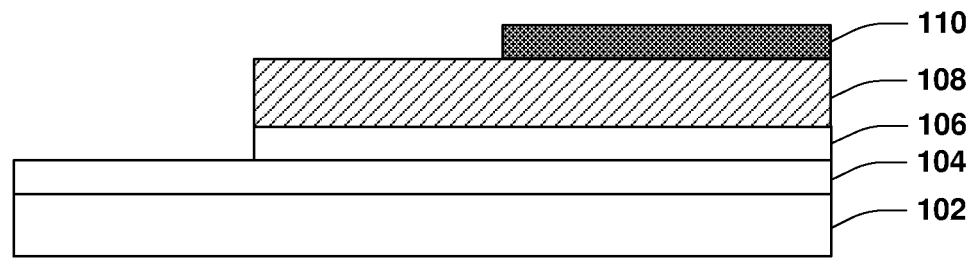

Still referring to FIG. 2, the second photoresist layer 112 is patterned to expose a second portion of the high-k dielectric layer 108, according to some embodiments. Referring to FIG. 3, portions of one or more layers not underlying, and thus not protected by, the patterned second photoresist layer 112 are removed by an etching process. For example, in the illustrated embodiment, a portion of the high-k dielectric layer 108 and a portion of the barrier layer 106 are removed to expose the first semiconductor layer 104. In some embodiments, the etching process is at least one of a plasma etching process, an RIE process, a wet etching process, or other applicable techniques. The patterned second photoresist layer 112 is then removed to expose the gate metallization layer 110 and the first portion of the high-k dielectric layer 108.

Figure 4:
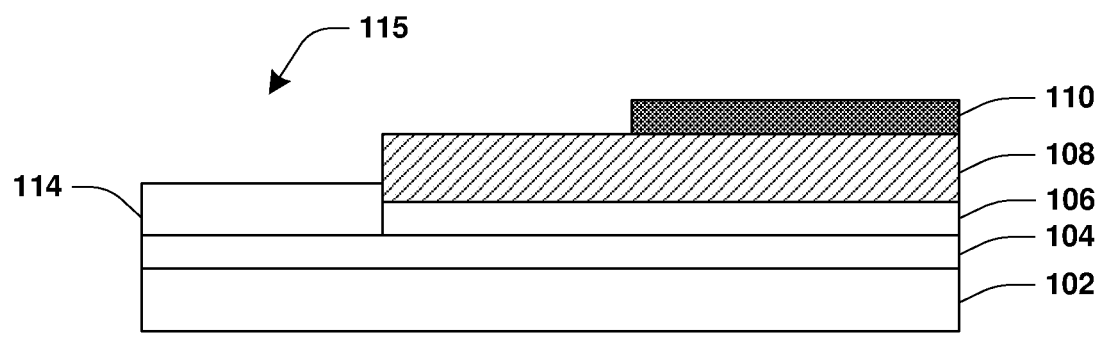

Referring to FIG. 4, in some embodiments, a first epitaxial layer 114 is formed over the first semiconductor layer 104. In some embodiments, the first epitaxial layer 114 fills a portion of a recess 115 created by the removal of the portion of the barrier layer 106 and the portion of the high-k dielectric layer 108. According to some embodiments, the first epitaxial layer 114 is selectively grown on the first semiconductor layer 104 in a conformal manner in the recess 115. In some embodiments, due to the selective, conformal growth of the first epitaxial layer 114 in the recess 115, the first epitaxial layer 114 abuts a sidewall of the barrier layer 106 and there is little to no gap between the first epitaxial layer 114 and the sidewall of the barrier layer 106. According to some embodiments, due to the selective, conformal growth of the first epitaxial layer 114 in the recess 115, the first epitaxial layer 114 abuts a sidewall of the high-k dielectric layer 108 and there is little to no gap between the first epitaxial layer 114 and the sidewall of the high-k dielectric layer 108. According to some embodiments, the first epitaxial layer 114 is formed to be in direct contact with the first semiconductor layer 104.

In some embodiments, the first epitaxial layer 114 comprises germanium. In some embodiments, the first epitaxial layer 114 is doped by n-type dopants to increase a free charge carrier concentration of electrons in the first epitaxial layer 114. In some embodiments, the first epitaxial layer 114 is a phosphorus doped germanium (Ge:P) layer. According to some embodiments, the first epitaxial layer 114 is formed by at least one at least one of CVD, LPCVD, PECVD, UHVCVD, RPCVD, ALD, physical vapor deposition, PLD, sputtering, evaporative deposition, VPE, MBE, LPE, or other applicable techniques. In some embodiments, the first epitaxial layer 114 is formed using $Ge_2H_6$ (1% in $H_2$) with a level of phosphorus doping of 5-15% $PH_3$ in He. In some embodiments, $GeH_4$ is used as a precursor for forming the first epitaxial layer 114. In some embodiments, conditions for selectively grown epitaxial Ge:P using $GeH_4$ as a precursor flowing at 50-800 sccm are a temperature of 450-500 degrees Celsius and a pressure of 10-100 Torr. In some embodiments, conditions for selectively grown epitaxial Ge:P using $Ge_2H_6$ as a precursor flowing at 50-800 sccm are a temperature of 350-500 degrees Celsius and a pressure of 10-100 Torr. In some embodiments, an n-type doping source is $PH_3$ with a dilution in $H_2$—He at 3-30 slm. In some embodiments, at least one of source or injection rates of the n-type doping source $PH_3$ are 30-400 sccm.

Figure 5:
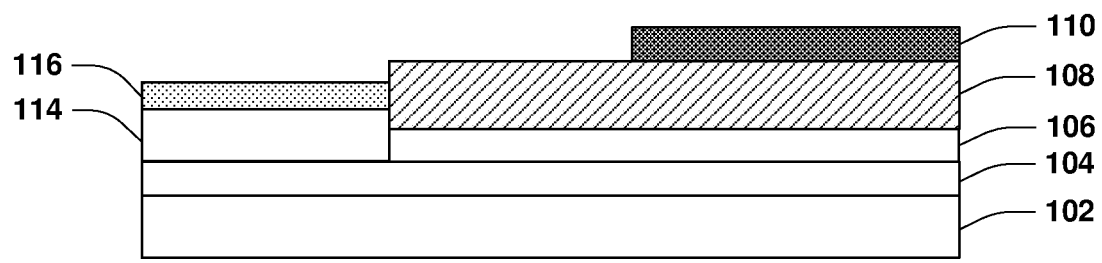

Referring to FIG. 5, in some embodiments, a second epitaxial layer 116 is formed over the first epitaxial layer 114. In some embodiments, the second epitaxial layer 116 is selectively grown on the first epitaxial layer 114 in a conformal manner in the recess 115. In some embodiments, due to the selective, conformal growth of the second epitaxial layer 116 in the recess 115, the second epitaxial layer 116 abuts a sidewall of the high-k dielectric layer 108 and there is little to no gap between the second epitaxial layer 116 and the sidewall of the high-k dielectric layer 108. According to some embodiments, the second epitaxial layer 116 is formed to be in contact with the first epitaxial layer 114.

In some embodiments, the second epitaxial layer 116 comprises $Si_x Ge_{1-x}$, where x<1. In some embodiments, the second epitaxial layer 116 is an n-type SiGe layer. In some embodiments, the second epitaxial layer 116 comprises a graded composition. That is, a concentration of a material in the second epitaxial layer 116 changes (increases or decreases) in a direction moving from the first semiconductor layer 104 toward a top surface of the second epitaxial layer 116. In some embodiments, an n-type dopant in the second epitaxial layer 116 is phosphorus. According to some embodiments, the second epitaxial layer 116 is formed by at least one of CVD, LPCVD, PECVD, UHVCVD, RPCVD, ALD, physical vapor deposition, PLD, sputtering, evaporative deposition, VPE, MBE, LPE, or other applicable techniques.

According to some embodiments, the second epitaxial layer 116 is formed using $Ge_2H_6$ (1% in $H_2$) at a flow rate of 50-800 sccm and at a temperature of 350-500 degrees Celsius at a pressure of 10-200 Torr. According to some embodiments, $Si_2H_6$ is a second precursor to the formation of the second epitaxial layer 116, with a flow rate of 20-300 sccm at a pressure of 10-200 Torr and a temperature of 350-550 degrees Celsius. An n-type doping source, according to some embodiments, is $PH_3$ diluted in $H_2$—He at 3-30 slm, injected into a reactor at 30-400 sccm. In some embodiments, the second epitaxial layer 116 is formed by a $GeH_4$ precursor at a flow rate of 50-800 sccm, a pressure of 10-200 Torr and at a temperature of 450-500 degrees Celsius. In some embodiments, $SiH_4$ is a second precursor to the formation of the second epitaxial layer 116, with a flow rate of 20-300 sccm, a pressure of 10-200 Torr and a temperature of 450-550 degrees Celsius. In some embodiments, an atomic percentage of germanium in the second epitaxial layer 116 is in the range of 30-80%.

Figure 6:
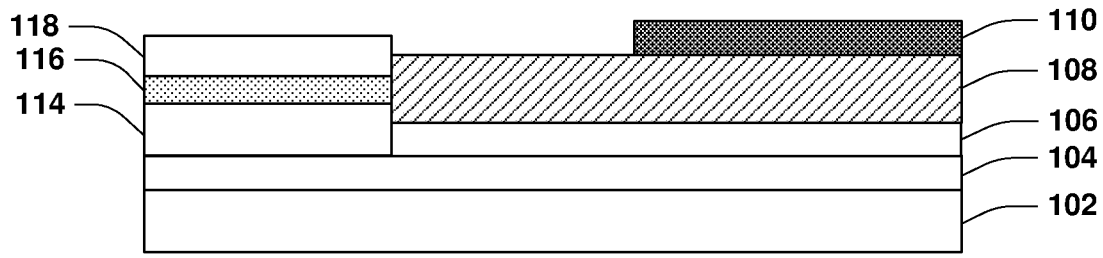

Referring to FIG. 6, in some embodiments, a third epitaxial layer 118 is formed over the second epitaxial layer 116. In some embodiments, the third epitaxial layer 118 is selectively grown on a top surface of the second epitaxial layer 116 and conformally fills the recess 115 to contact a sidewall of the high-k dielectric layer 108. In some embodiments, the second epitaxial layer 116 is not present and the third epitaxial layer 118 is selectively grown on a top surface of the first epitaxial layer 114 conformally fills the recess 115 to contact a sidewall of the high-k dielectric layer 108.

In some embodiments, the third epitaxial layer 118 comprises silicon. In some embodiments, the third epitaxial layer 118 is doped by n-type dopants to increase a free charge carrier concentration of electrons in the third epitaxial layer 118. In some embodiments, the third epitaxial layer 118 is a phosphorus doped silicon (Si:P) layer. According to some embodiments, the third epitaxial layer 118 is formed by at least one of CVD, LPCVD, PECVD, UHVCVD, RPCVD, ALD, PVD, PLD, sputtering, evaporative deposition, VPE, MBE, LPE, or other applicable techniques.

In some embodiments, the third epitaxial layer 118 undergoes selective epitaxial growth (SEG) over the first epitaxial layer 114 or the second epitaxial layer 116 using dichlorosilane (DCS) as a precursor with a flow rate between 70-300 sccm, at a temperature between 650-800 degrees Celsius and at a pressure of 20-200 Torr. In some embodiments, the third epitaxial layer 118 is non-selectively grown over first epitaxial layer 114 or the second epitaxial layer 116 with a precursor comprising $Si_3H_8$, at a flow rate of 20-300 mg/min at a temperature of 400-550 degrees Celsius at a pressure of 20-200 Torr. In some embodiments, at least one of $Si_2H_4$ or $Si_4H_{10}$ are used as precursors in non-selective growth of the third epitaxial layer 118. In some embodiments, a phosphorus source for growing the third epitaxial layer 118, either selectively or non-selectively, is $PH_3$ with a source and injection rate of 300-900 sccm. In some embodiments, the $PH_3$ source is not diluted in $H_2$—He. In some embodiments, a source for phosphorus to dope the third epitaxial layer 118 is $PH_3$ diluted in He, where the concentration of $PH_3$ is in a range of 5%-15% by volume percentage.

Figure 7:
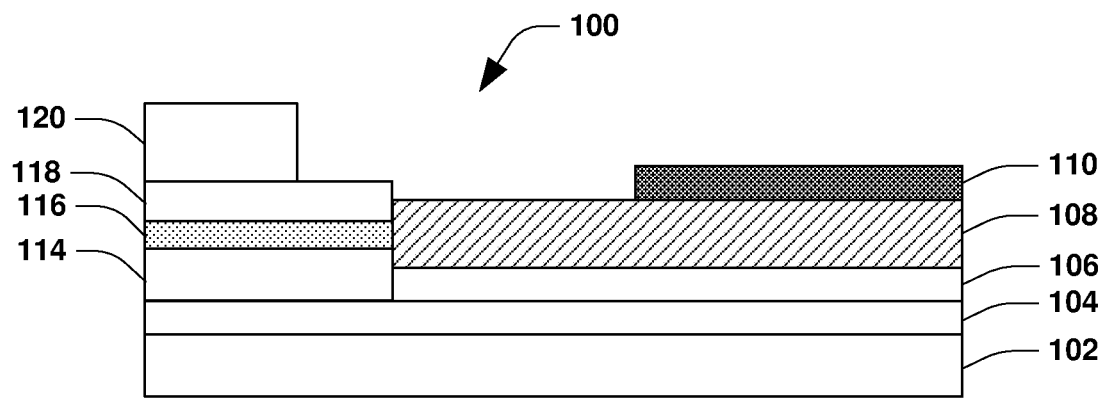

Referring to FIG. 7, in some embodiments, a contact layer 120 is formed over the third epitaxial layer 118. In some embodiments, the contact layer 120 is formed of at least one of a conductive metallic layer or an electrically conducting layer. In some embodiments, the contact layer 120 comprises at least one of Co, Ni, W, Ti, Ta, Cu, Al, Mo, TiN, TaN, WSi, Ni—Si, Co—Si, WN, TiAlN, TaCN, TaC, TaSiN, metal alloys such as Ti—Al alloy, Al—Cu alloy, or other suitable materials. In some embodiments, the contact layer 120 is formed by at least one of PVD, CVD, LPCVD, ALCVD, UHVCVD, RPCVD, MBE, or other applicable techniques. In some embodiments, the contact layer 120 is subjected to chemical mechanical polishing (CMP), etching, or the like. In some embodiments, the contact layer 120 is formed to be in direct contact with the third epitaxial layer 118.

Figure 8:
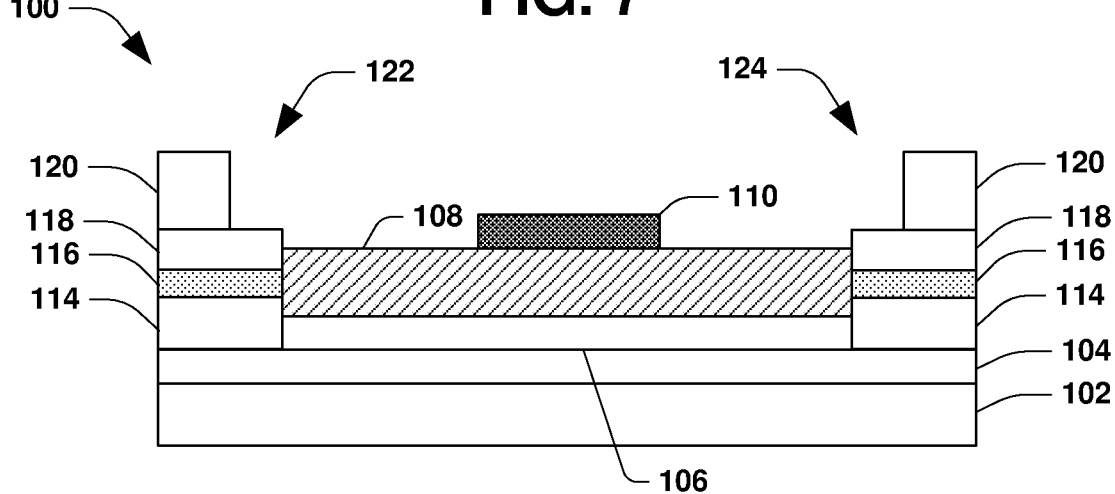
FIG. 8 illustrates a semiconductor arrangement, in accordance with one or more embodiments.

FIG. 8 illustrates a zoomed out view of a semiconductor arrangement 100 resulting from the aforementioned method, according to some embodiments. It may be appreciated that while FIGS. 1-7 illustrate a formation process for one-half of the semiconductor arrangement 100, the same or a similar process may be performed to form the other half of the semiconductor arrangement. The semiconductor arrangement 100 comprises a transistor, a first contact 122 for providing electrical conductivity to a first source/drain region underlying the first contact 122 and within at least one of the substrate 102 or the first semiconductor layer 104, and a second contact 124 for providing electrical conductivity to a second source/drain region underlying the second contact 124 and within at least one of the substrate 102 or the first semiconductor layer 104. In some embodiments, the first contact 122 comprises a first instance of the first epitaxial layer 114, a first instance of the second epitaxial layer 116, a first instance of the third epitaxial layer 118, and a first instance of the contact layer 120. In some embodiments where the second epitaxial layer 116 is not present, the first contact 122 comprises the first instance of the first epitaxial layer 114, the first instance of the third epitaxial layer 118, and the first instance of the contact layer 120. In some embodiments, the second contact 124 comprises a second instance of the first epitaxial layer 114, a second instance of the second epitaxial layer 116, a second instance of the third epitaxial layer 118, and a second instance of the contact layer 120. In some embodiments where the second epitaxial layer 116 is not present, the second contact 124 comprises the second instance of the first epitaxial layer 114, the second instance of the third epitaxial layer 118, and the second instance of the contact layer 120.

A gate structure of the transistor is disposed between the first contact 122 and the second contact 124. The gate structure comprises, among other things, the barrier layer 106, the high-k dielectric layer 108, and the gate metallization layer 110. A channel of the transistor underlies the gate structure. In some embodiments, the transistor is a HEMT.

Figure 9:
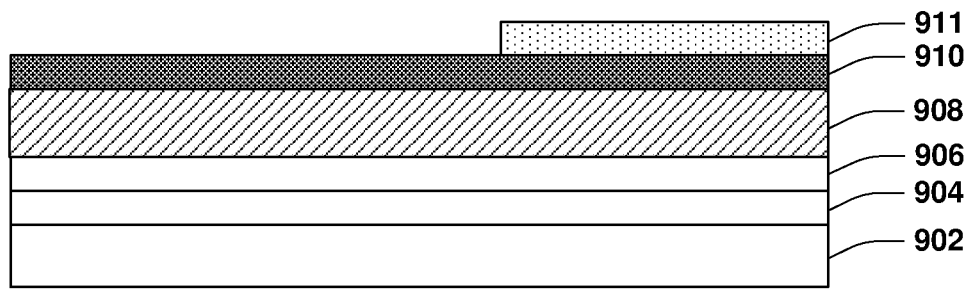
FIGS. 9-18 are illustrations of a semiconductor arrangement at various stages of fabrication, in accordance with one or more embodiments.

Turning to FIG. 9, a plurality of layers used in the formation of a semiconductor arrangement are illustrated, in accordance with some embodiments. In some embodiments, at least some of the layers, features, formation techniques, etc. discussed with respect to FIGS. 9-18 mimic at least some of the layers, features, formation techniques, etc. discussed with respect to FIGS. 1-7 and thus are not described in detail so as to limit redundancy. In some embodiments, the semiconductor arrangement comprises an ohmic contact in a HEMT. The plurality of layers are formed over a substrate 902. In some embodiments, the substrate 902 comprises at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the substrate 102 comprises one of any Group III-V or Group II-VI semiconductor. In some embodiments, the substrate 102 comprises crystalline silicon.

In some embodiments, a first semiconductor layer 904 is formed over the substrate 902. In some embodiments, the first semiconductor layer 904 is an InGaAs layer. According to some embodiments, the first semiconductor layer 904 is formed by at least one of CVD, MOCVD, LPCVD, PECVD, UHVCVD, RPCVD, ALD, physical vapor deposition, pulsed laser deposition, sputtering, evaporative deposition, VPE, MBE, LPE, or other applicable techniques. In some embodiments, one or more buffer layers (not shown) are formed between the substrate 902 and the first semiconductor layer 904 to relax a lattice mismatch between the first semiconductor layer 904 and the substrate 902. In some embodiments, the first semiconductor layer 904 is the substrate 902 or is part of the substrate 902. If the first semiconductor layer 904 is the substrate 902 or is part of the substrate 902, the substrate 902 is treated to have at least some of the aforementioned characteristics of the first semiconductor layer 904.

In some embodiments, a barrier layer 906 is formed over the first semiconductor layer 904 by at least one of CVD, LPCVD, PECVD, UHVCVD, RPCVD, ALD, PVD, pulsed laser deposition, sputtering, evaporative deposition, VPE, MBE, LPE, or other applicable techniques. In some embodiments, the barrier layer 906 is formed to a thickness of at least 5 nm to reduce leakage current and decrease parasitic capacitance. In some embodiments, the barrier layer 906 is formed of a semiconductor doped with a dopant to supply free carriers to the first semiconductor layer 904 by an in-situ deposition method or other applicable techniques. In some embodiments, the barrier layer 906 is an AlGaAs layer. In some embodiments, the barrier layer 906 is formed to be in direct contact with the first semiconductor layer 904 or is formed to be in direct contact with the substrate 902 in embodiments where the first semiconductor layer 904 is part of the substrate 902.

In some embodiments, a high-k dielectric layer 908 is formed over the barrier layer 906. The high-k dielectric layer 908 is formed over the over the barrier layer 906 by at least one of CVD, LPCVD, PECVD, ALD, PVD, pulsed laser deposition, sputtering, evaporative deposition, VPE, MBE, ALD, LPE, or other applicable techniques. In some embodiments, the high-k dielectric layer 908 is formed to be in direct contact with the barrier layer 906.

In some embodiments, a gate metallization layer 910 is formed over the high-k dielectric layer 908. In some embodiments, the gate metallization layer 910 comprises at least one of a conductive metallic layer or an electrically conducting layer. In some embodiments, the gate metallization layer 910 comprises at least one of Co, Ni, W, Ti, Ta, Cu, Al, Mo, TiN, TaN, WSi, Ni—Si, Co—Si, WN, TiAlN, TaCN, TaC, TaSiN, metal alloys such as Ti—Al alloy, Al—Cu alloy, or other suitable materials. In some embodiments, the gate metallization layer 910 is formed by at least one of PVD, CVD, LPCVD, ALCVD, UHVCVD, RPCVD, VPE, LPE, MBE, or other applicable techniques. In some embodiments, the gate metallization layer 910 is subjected to CMP. In some embodiments, the gate metallization layer 910 is formed to be in direct contact with the high-k dielectric layer 908.

According to some embodiments, a photoresist layer 911 is formed over the gate metallization layer 910. In some embodiments, the photoresist layer 911 is formed by at least one of spinning, spray coating, or other applicable techniques. The photoresist layer 911 comprises a light sensitive material such that properties, such as solubility, of the photoresist layer 911 are affected by light. The photoresist layer 911 is either a negative photoresist or a positive photoresist. In some embodiments, the photoresist layer 911 is formed to be in direct contact with the gate metallization layer 910.

Figure 10:
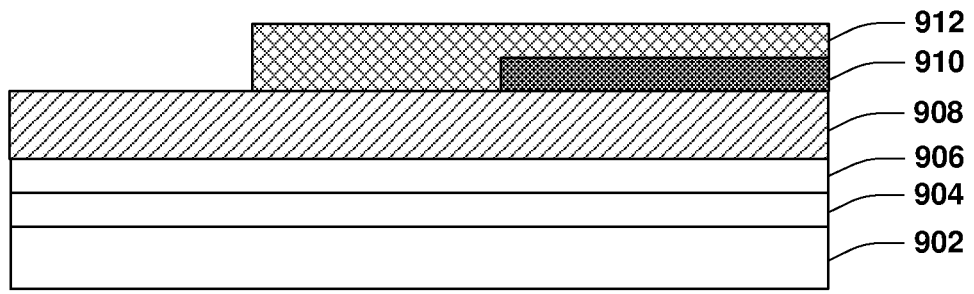

As illustrated in FIG. 9, the photoresist layer 911 is patterned to expose a portion of the gate metallization layer 910, according to some embodiments. Referring to FIG. 10, a portion of the gate metallization layer 910 not underlying, and thus not protected by, the patterned photoresist layer 911 is removed by an etching process. For example, in the illustrated embodiment, a portion of the gate metallization layer 910 is removed to expose a first portion of the high-k dielectric layer 908. In some embodiments, the etching process is at least one of a plasma etching process, an RIE process, a wet etching process, or other applicable techniques. The patterned photoresist layer 911 is then removed to expose the gate metallization layer 910, and a second photoresist layer 912 is formed over the gate metallization layer 910 and the first portion of the high-k dielectric layer 908. In some embodiments, the second photoresist layer 912 is formed to be in direct contact with the gate metallization layer 910 and the high-k dielectric layer 908.

In some embodiments, the second photoresist layer 912 is formed by at least one of spinning, spray coating, or other applicable techniques. The second photoresist layer 912 comprises a light sensitive material such that properties, such as solubility, of the second photoresist layer 912 are affected by light. The second photoresist layer 912 is either a negative photoresist or a positive photoresist.

Figure 11:
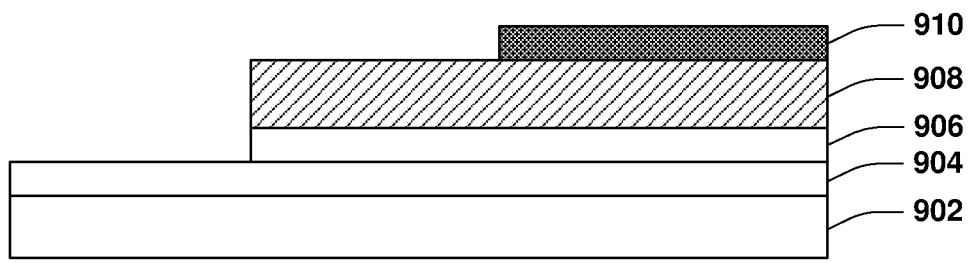

Still referring to FIG. 10, the second photoresist layer 912 is patterned to expose a second portion of the high-k dielectric layer 908, according to some embodiments. Referring to FIG. 11, portions of one or more layers not underlying, and thus not protected by, the patterned second photoresist layer 912 are removed by an etching process. For example, in the illustrated embodiment, a portion of the high-k dielectric layer 908 and a portion of the barrier layer 906 are removed to expose the first semiconductor layer 904. In some embodiments, the etching process is at least one of a plasma etching process, an RIE process, a wet etching process, or other applicable techniques. The patterned second photoresist layer 912 is then removed to expose the gate metallization layer 910 and the first portion of the high-k dielectric layer 908.

Figure 12:
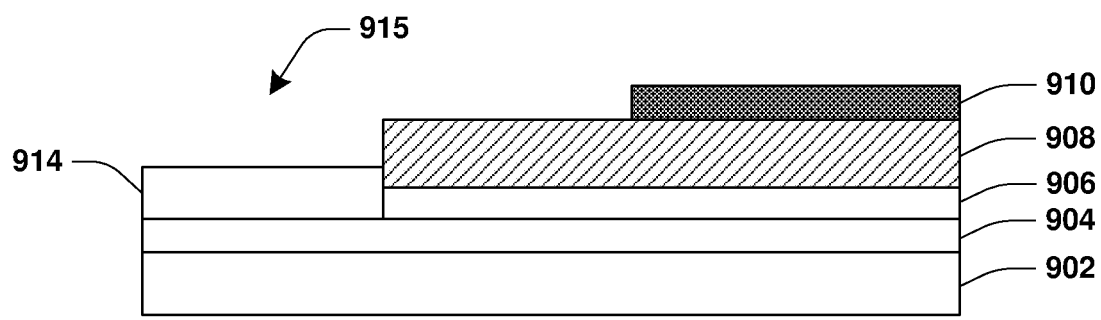

Referring to FIG. 12, in some embodiments, a first epitaxial layer 914 is formed over the first semiconductor layer 904. In some embodiments, the first epitaxial layer 914 fills a portion of a recess 915 created by the removal of the portion of the barrier layer 906 and the portion of the high-k dielectric layer 908. According to some embodiments, the first epitaxial layer 914 is selectively grown on the first semiconductor layer 904 in a conformal manner in the recess 915. In some embodiments, due to the selective, conformal growth of the first epitaxial layer 914 in the recess 915, the first epitaxial layer 914 abuts a sidewall of the barrier layer 906 and there is little to no gap between the first epitaxial layer 914 and the sidewall of the barrier layer 906. According to some embodiments, due to the selective, conformal growth of the first epitaxial layer 114 in the recess 115, the first epitaxial layer 914 abuts a sidewall of the high-k dielectric layer 908 and there is little to no gap between the first epitaxial layer 914 and the sidewall of the high-k dielectric layer 908. According to some embodiments, the first epitaxial layer 914 is formed to be in direct contact with the first semiconductor layer 904.

In some embodiments, the first epitaxial layer 914 comprises germanium. In some embodiments, the first epitaxial layer 914 is doped by n-type dopants to increase a free charge carrier concentration of electrons in the first epitaxial layer 914. In some embodiments, the first epitaxial layer 914 is a phosphorus doped germanium (Ge:P) layer. According to some embodiments, the first epitaxial layer 914 is formed by at least one at least one of CVD, LPCVD, PECVD, UHVCVD, RPCVD, ALD, PVD, PLD, sputtering, evaporative deposition, VPE, MBE, LPE, or other applicable techniques. In some embodiments, the first epitaxial layer 914 is formed using $Ge_2H_6$ (1% in $H_2$) with a level of phosphorus doping of 5-15% $PH_3$ in He. In some embodiments, $GeH_4$ is used as a precursor for forming the first epitaxial layer 914. In some embodiments, conditions for selectively grown epitaxial Ge:P using $GeH_4$ as a precursor flowing at 50-800 sccm are a temperature of 450-500 degrees Celsius and a pressure of 10-100 Torr. In some embodiments, conditions for selectively grown epitaxial Ge:P using $Ge_2H_6$ as a precursor flowing at 50-800 sccm are a temperature of 350-500 degrees Celsius and a pressure of 10-100 Torr. In some embodiments, an n-type doping source is $PH_3$ with a dilution in $H_2$—He at 3-30 slm. In some embodiments, at least one of source or injection rates of the n-type doping source $PH_3$ are 30-400 sccm.

Figure 13:
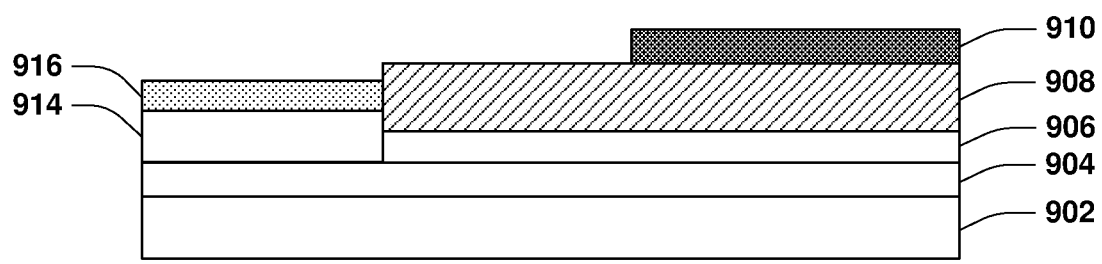

Referring to FIG. 13, in some embodiments, a second epitaxial layer 916 is formed over the first epitaxial layer 914. In some embodiments, the second epitaxial layer 916 is selectively grown on the first epitaxial layer 914 in a conformal manner in the recess 915. In some embodiments, due to the selective, conformal growth of the second epitaxial layer 916 in the recess 915, such that the second epitaxial layer 916 abuts a sidewall of the high-k dielectric layer 908 and there is little to no gap between the second epitaxial layer 916 and the sidewall of the high-k dielectric layer 908. According to some embodiments, the second epitaxial layer 916 is formed to be in contact with the first epitaxial layer 914.

In some embodiments, the second epitaxial layer 916 comprises $Si_x Ge_{1-x}$, where x<1. In some embodiments, the second epitaxial layer 916 is an n-type SiGe layer. In some embodiments, the second epitaxial layer 916 comprises a graded composition. That is, a concentration of material in the second epitaxial layer 916 changes (increases or decreases) in a direction moving from the first semiconductor layer 904 toward a top surface of the second epitaxial layer 916. In some embodiments, an n-type dopant in the second epitaxial layer 916 is phosphorus. According to some embodiments, the second epitaxial layer 916 is formed by at least one of CVD, LPCVD, PECVD, UHVCVD, RPCVD, ALD, PVD, PLD, sputtering, evaporative deposition, VPE, MBE, LPE, or other applicable techniques.

According to some embodiments, the second epitaxial layer 916 is formed using $Ge_2H_6$ (1% in $H_2$) at a flow rate of 50-800 sccm and at a temperature of 350-500 degrees Celsius at a pressure of 10-200 Torr. According to some embodiments, $Si_2H_6$ is a second precursor to the formation of the second epitaxial layer 916, with a flow rate of 20-300 sccm at a pressure of 10-200 Torr and a temperature of 350-550 degrees Celsius. An n-type doping source, according to some embodiments, is $PH_3$ diluted in $H_2$—He at 3-30 slm, injected into a reactor at 30-400 sccm. In some embodiments, the second epitaxial layer 916 is formed by a $GeH_4$ precursor at a flow rate of 50-800 sccm, a pressure of 10-200 Torr and at a temperature of 450-500 degrees Celsius. In some embodiments, $SiH_4$ is a second precursor to the formation of the second epitaxial layer 916, with a flow rate of 20-300 sccm, a pressure of 10-200 Torr and a temperature of 450-550 degrees Celsius. In some embodiments, an atomic percentage of germanium in the second epitaxial layer is in the range of 30-80%

Figure 14:
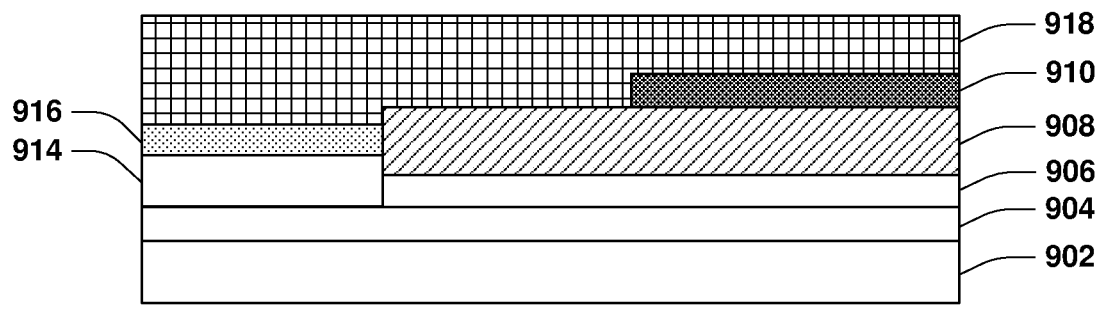

Referring to FIG. 14, an oxide mask layer 918 is formed over the gate metallization layer 910 and the second epitaxial layer 916 or the first epitaxial layer 914 when the second epitaxial layer 916 is not present. In some embodiments, the oxide mask layer 918 comprises $SiO_2$ or other dielectric material. In some embodiments, the oxide mask layer 918 is formed by at least one of CVD, LPCVD, PECVD, UHVCVD, RPCVD, ALD, PVD, PLD, evaporative deposition, VPE, MBE, LPE, or other applicable techniques. In some embodiments, the oxide mask layer 918 is formed to contact a top surface of the gate metallization layer 910, a top surface of the high-k dielectric layer 908, a top surface of the second epitaxial layer 916, and at least one of a sidewall of the high-k dielectric layer 908 or a sidewall of the gate metallization layer 910. In some embodiments where the second epitaxial layer 916 is not present, the oxide mask layer 918 is formed to contact a top surface of the gate metallization layer 910, a top surface of the high-k dielectric layer, a top surface of the first epitaxial layer 914, and at least one of a sidewall of the high-k dielectric layer 908 or a sidewall of the gate metallization layer 910.

Figure 15:
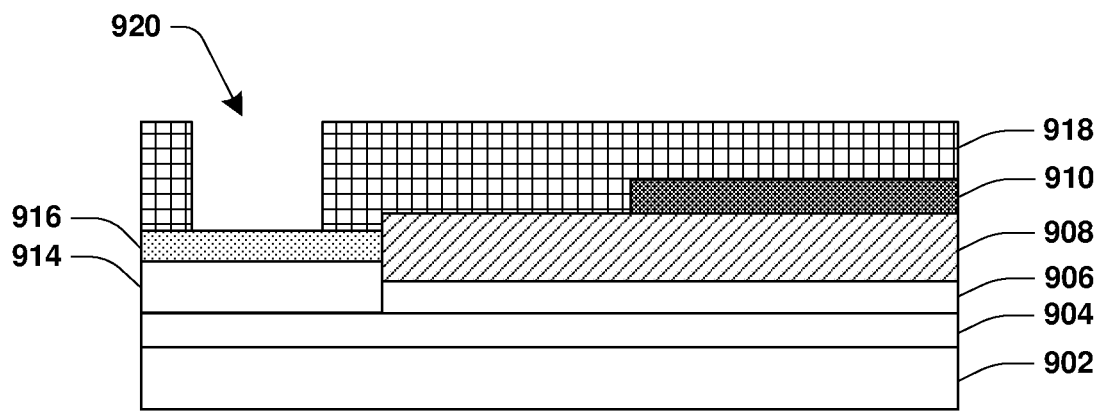

Referring to FIG. 15, the oxide mask layer 918 is patterned to form an opening 920 that exposes a portion of the second epitaxial layer 916 or a portion of the first epitaxial layer 914 when the second epitaxial layer 916 is not present, in accordance with some embodiments. In some embodiments, the oxide mask layer 918 is patterned using an etching process and a photoresist (not shown). In some embodiments, the etching process is at least one of a plasma etching process, a reactive ion etching (RIE) process, a wet etching process, or other applicable techniques.

Figure 16:
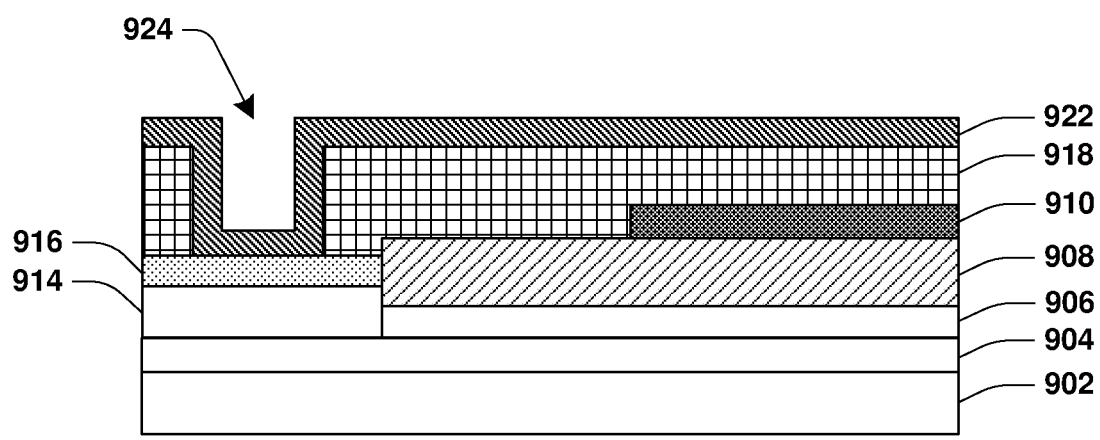

Referring to FIG. 16, a third epitaxial layer 922 is formed over the oxide mask layer 918 and in the opening 920. In some embodiments, the third epitaxial layer 922 is non-selectively grown over the oxide mask layer 918 and over the second epitaxial layer 916 such that the third epitaxial layer 922 contacts a top surface of the second epitaxial layer 916, sidewalls of the oxide mask layer 918 that defines the opening 920, and a top surface of the oxide mask layer 918. In some embodiments where the second epitaxial layer 916 is not present, the third epitaxial layer 922 is non-selectively grown over the oxide mask layer 918 and over the first epitaxial layer 914 such that the third epitaxial layer 922 contacts a top surface of the first epitaxial layer 914, sidewalls of the oxide mask layer 918 that defines the opening 920, and a top surface of the oxide mask layer 918.

In some embodiments, the third epitaxial layer 922 is grown conformally, allowing the third epitaxial layer 922 to grow on sidewalls of the oxide mask layer 918 that define the opening 920 and on a top surface of the oxide mask layer 918. In some embodiments, the third epitaxial layer 922 is grown non-selectively at a temperature of 450-500 degrees Celsius. In some embodiments, a second opening 924 is defined by sidewalls of the third epitaxial layer 922.

Figure 17:
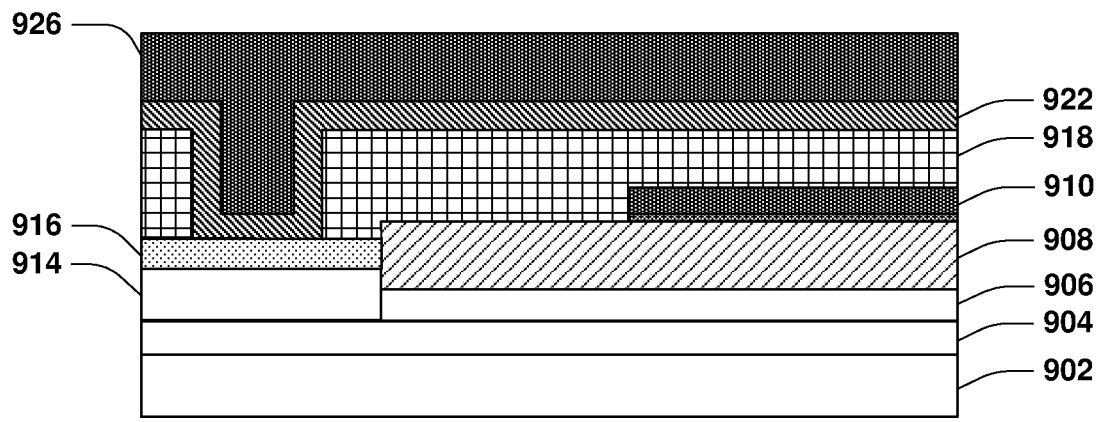

Referring to FIG. 17, a contact layer 926 is formed in the second opening 924 over the third epitaxial layer 922. In some embodiments, the contact layer 926 is formed of at least one of a conductive metallic layer or an electrically conducting layer. In some embodiments, the contact layer 926 comprises at least one of Co, Ni, W, Ti, Ta, Cu, Al, Mo, TiN, TaN, WSi, Ni—Si, Co—Si, WN, TiAlN, TaCN, TaC, TaSiN, metal alloys such as Ti—Al alloy, Al—Cu alloy, or other suitable materials. In some embodiments, the contact layer 926 is formed by at least one of PVD, CVD, LPCVD, ALCVD, ultrahigh vacuum CVD (UHVCVD), reduced pressure CVD (RPCVD), MBE, or other applicable techniques. In some embodiments, the contact layer 926 is formed to be in direct contact with the third epitaxial layer 922. In some embodiments, at least a portion of the contact layer 926 is grown, such as in the second opening 924.

Figure 18:
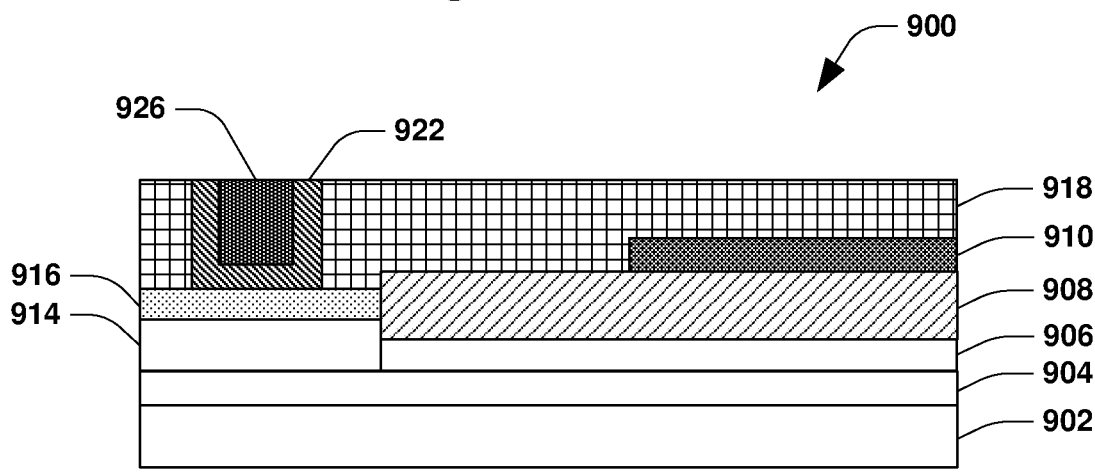

Referring to FIG. 18, at least one of the contact layer 926 or the third epitaxial layer 922 are planarized by chemical mechanical polishing to expose the oxide mask layer 918. It is to be appreciated that while FIGS. 17 and 18 illustrate the contact layer 926 as being formed before chemical mechanical polishing of the third epitaxial layer 922, in some embodiments the third epitaxial layer 922 is polished to expose the oxide mask layer 918 prior to the contact layer 926 being formed. In such embodiments, a top surface of the contact layer 926 may extend above a top surface of at least one of the third epitaxial layer 922 or the oxide mask layer 918

Figure 19:
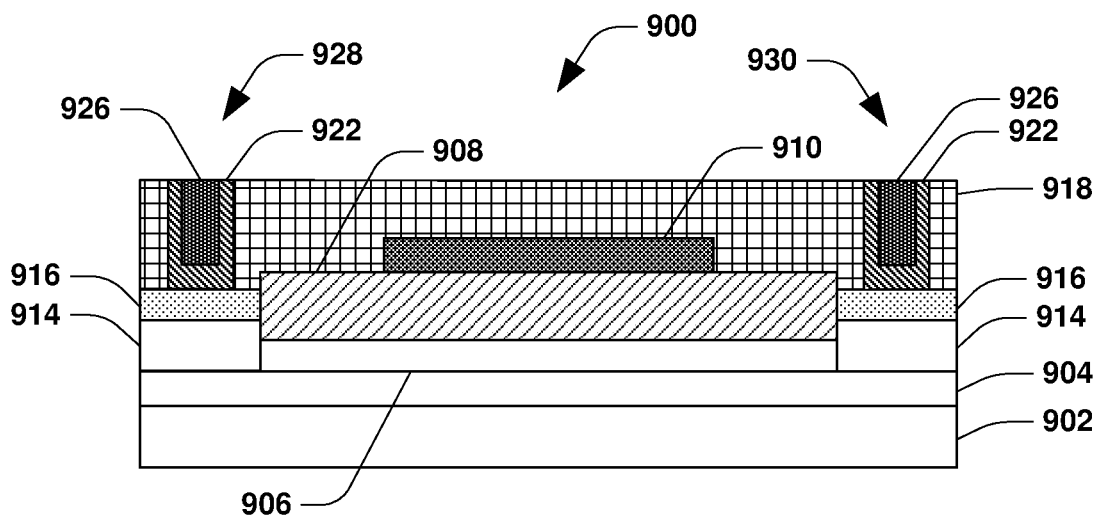
FIG. 19 illustrates a semiconductor arrangement, in accordance with one or more embodiments.

FIG. 19 illustrates a zoomed out view of a semiconductor arrangement 900 resulting from the aforementioned method, according to some embodiments. It may be appreciated that while FIGS. 9-17 illustrate a formation process for one-half of the semiconductor arrangement 900, the same or a similar process may be performed to form the other after of the semiconductor arrangement. The semiconductor arrangement 900 comprises a transistor, a first contact 928 for providing electrical conductivity to a first source/drain region underlying the first contact 928 and within at least one of the substrate 902 or the first semiconductor layer 904, and a second contact 930 for providing electrical conductivity to a second source/drain region underlying the second contact 930 and within at least one of the substrate 902 or the first semiconductor layer 904. In some embodiments, the first contact 928 comprises a first instance the first epitaxial layer 914, a first instance of the second epitaxial layer 916, a first instance of the third epitaxial layer 922, and a first instance of the contact layer 926. In some embodiments where the second epitaxial layer 916 is not present, the first contact 928 comprises the first instance of the first epitaxial layer 914, the first instance of the third epitaxial layer 922, and the first instance of the contact layer 926. In some embodiments, the second contact 930 comprises a second instance of the first epitaxial layer 914, a second instance of the second epitaxial layer 916, a second instance of the third epitaxial layer 922, and a second instance of the contact layer 926. In some embodiments where the second epitaxial layer 916 is not present, the second contact 930 comprises the second instance of the first epitaxial layer 914, the second instance of the third epitaxial layer 922, and the second instance of the contact layer 926.

A gate structure of the transistor is disposed between the first contact 928 and the second contact 930. The gate structure comprises, among other things, the barrier layer 906, the high-k dielectric layer 908, and the gate metallization layer 910. A channel of the transistor underlies the gate structure. In some embodiments, the transistor is a HEMT.

According to some embodiments, a contact structure of a semiconductor arrangement is formed at temperatures that are lower than temperature at which other materials or interfaces of the semiconductor arrangement melt or are otherwise adversely affected. In this way, an interface between the high-k dielectric layer 108/808 and the barrier layer 106/806, which typically degrades at a temperature far lower than other epitaxial layers, is prevented from degradation or degradation is minimized. Components of the contact structure are epitaxial layers that are grown, rather than layers that formed in other manners that require higher temperatures, such as 600 degrees Celsius or greater, than temperatures used in growing the epitaxial contact layers, which are generally between 350 degrees Celsius and 550 degrees Celsius as described above. The contact structure provides electrical connectivity to a source/drain region of a HEMT in some embodiments, where temperatures used to form the contact structure do not exceed temperatures used in forming the HEMT. According to some embodiments, the contact structure provides electrical connectivity to a source/drain region of a compound semiconductor heterojunction device. In some embodiments, a compound semiconductor heterojunction device includes any device formed from any Group III-V or Group II-VI semiconductor.

Moreover, the formation of the contact structure according to the aforementioned techniques reduce or minimize the amount of metal alloys present in the contact structure, which tend to degrade over time. Further, the formation of the contact structure against the barrier layer and the high-k dielectric layer reduces, minimizes, or eliminates gaps present between the contact structure and barrier layer and between the contact structure and the high-k dielectric layer, which mitigates channel surface depletion that can cause the contact structure to degrade.

In some embodiments, a method of forming a semiconductor arrangement includes forming a semiconductor layer, wherein the semiconductor layer comprises a source/drain region. In some embodiments, the method includes selectively growing a first epitaxial layer conformally over the semiconductor layer. In some embodiments, the method includes forming a second epitaxial layer over the first epitaxial layer. In some embodiments, the method includes forming a contact layer over the second epitaxial layer, wherein the first epitaxial layer, the second epitaxial layer, and the contact layer define a contact structure for the source/drain region.

In some embodiments, a semiconductor arrangement includes a semiconductor layer having a source/drain region, a barrier layer over the semiconductor layer, a high-k dielectric layer over the barrier layer, and a first epitaxial layer over the semiconductor layer. In some embodiments, a sidewall of the first epitaxial layer contacts the barrier layer and the high-k dielectric layer. In some embodiments, the semiconductor arrangement includes a second epitaxial layer over the first epitaxial layer, wherein the first epitaxial layer and the second epitaxial layer define a contact structure for the source/drain region.

In some embodiments, a high electron mobility transistor (HEMT) includes an InGaAs layer having a source/drain region and a channel region. In some embodiments, the semiconductor arrangement includes a first epitaxial layer over the source/drain region. In some embodiments, the semiconductor arrangement includes a high-k dielectric layer over the channel region, wherein a sidewall of the high-k dielectric layer contacts a sidewall of the first epitaxial layer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
 a semiconductor layer comprising a source/drain region;
 a barrier layer over the semiconductor layer;
 a high-k dielectric layer over the barrier layer;
 a first epitaxial layer over the semiconductor layer, wherein a sidewall of the first epitaxial layer contacts the barrier layer and the high-k dielectric layer;
 a second epitaxial layer over the first epitaxial layer; and
 a third epitaxial layer over the second epitaxial layer, wherein the first epitaxial layer, the second epitaxial layer, and the third epitaxial layer define a contact structure for the source/drain region.

2. The semiconductor arrangement of claim 1, wherein:
 the second epitaxial layer comprises germanium, and
 a concentration of germanium in a first region of the second epitaxial layer is different than the concentration of germanium in a second region of the second epitaxial layer above the first region.

3. The semiconductor arrangement of claim 1, wherein:
 the semiconductor layer comprises a channel region, and
 the high-k dielectric layer is over the channel region of the semiconductor layer.

4. The semiconductor arrangement of claim 1, wherein the third epitaxial layer is in contact with the high-k dielectric layer.

5. The semiconductor arrangement of claim 1, comprising:
   a dielectric layer, wherein the high-k dielectric layer is separated from the third epitaxial layer by the dielectric layer.

6. The semiconductor arrangement of claim 1, wherein the semiconductor layer comprises InGaAs.

7. The semiconductor arrangement of claim 1, wherein the first epitaxial layer comprises phosphorus doped germanium.

8. The semiconductor arrangement of claim 7, wherein the third epitaxial layer comprises phosphorus doped silicon.

9. The semiconductor arrangement of claim 2, wherein the concentration of germanium in the second region is less than the concentration of germanium in the first region.

10. The semiconductor arrangement of claim 1, wherein the third epitaxial layer comprises phosphorus doped silicon.

11. The semiconductor arrangement of claim 1, comprising:
    a dielectric layer, wherein a sidewall of the third epitaxial layer is in contact with the dielectric layer.

12. The semiconductor arrangement of claim 1, comprising:
    a metal contact layer over the third epitaxial layer, wherein the contact structure is further defined by the metal contact layer.

13. The semiconductor arrangement of claim 12, wherein a sidewall of the third epitaxial layer is in contact with a sidewall of the metal contact layer.

14. A semiconductor arrangement, comprising:
    a semiconductor layer comprising a source/drain region;
    a first epitaxial layer over the semiconductor layer;
    a second epitaxial layer over the first epitaxial layer;
    a dielectric layer overlying the second epitaxial layer; and
    a third epitaxial layer overlying the second epitaxial layer and laterally adjacent the dielectric layer, wherein the first epitaxial layer, the second epitaxial layer, and the third epitaxial layer define a contact structure for the source/drain region.

15. The semiconductor arrangement of claim 14, comprising:
    a high-k dielectric layer over the semiconductor layer, wherein the third epitaxial layer is spaced apart from the high-k dielectric layer by the dielectric layer.

16. The semiconductor arrangement of claim 14, wherein the dielectric layer is in contact with a top surface of the second epitaxial layer.

17. The semiconductor arrangement of claim 14, wherein the dielectric layer is in contact with a sidewall of the third epitaxial layer.

18. A semiconductor arrangement, comprising:
    a InGaAs layer comprising a source/drain region;
    a first epitaxial layer over the InGaAs layer, wherein the first epitaxial layer comprises germanium;
    a second epitaxial layer over the first epitaxial layer; and
    a third epitaxial layer overlying the second first epitaxial layer, wherein:
      the third epitaxial layer comprises silicon, and
      the first epitaxial layer, the second epitaxial layer, and the third epitaxial layer define a contact structure for the source/drain region.

19. The semiconductor arrangement of claim 1, comprising a gate metallization layer over the high-k dielectric layer.

20. The semiconductor arrangement of claim 19, wherein the gate metallization layer is in direct contact with a top surface of the high-k dielectric layer.

* * * * *